United States Patent
Geaghan (10) Patent No.: US 7,830,157 B2
(45) Date of Patent: Nov. 9, 2010

(54) PULSED CAPACITANCE MEASURING CIRCUITS AND METHODS

(75) Inventor: Bernard O. Geaghan, Salem, NH (US)

(73) Assignee: 3M Innovative Properties Company, Saint Paul, MN (US)

( * ) Notice: Subject to any disclaimer, the term of this patent is extended or adjusted under 35 U.S.C. 154(b) by 479 days.

(21) Appl. No.: 12/027,838

(22) Filed: Feb. 7, 2008

(65) Prior Publication Data

US 2009/0167325 A1    Jul. 2, 2009

Related U.S. Application Data

(60) Provisional application No. 61/017,451, filed on Dec. 28, 2007.

(51) Int. Cl.
*G01R 27/26* (2006.01)

(52) U.S. Cl. ......................... 324/678; 324/658

(58) Field of Classification Search .................. 324/658, 324/678
See application file for complete search history.

(56) References Cited

U.S. PATENT DOCUMENTS

| | | | |
|---|---|---|---|
| 4,887,024 A | 12/1989 | Sugiyama et al. | |
| 4,954,823 A | 9/1990 | Binstead | |
| 5,136,251 A | 8/1992 | George et al. | |
| 5,374,787 A | 12/1994 | Miller et al. | |
| 5,461,321 A | 10/1995 | Sanders et al. | |
| 5,650,597 A | 7/1997 | Redmayne | |
| 5,861,583 A | 1/1999 | Schediwy et al. | |
| 5,926,409 A | 7/1999 | Engh et al. | |
| 6,239,389 B1 | 5/2001 | Allen et al. | |
| 6,275,047 B1* | 8/2001 | Zoellick et al. | 324/678 |
| 6,356,086 B1* | 3/2002 | Cook et al. | 324/659 |
| 6,466,036 B1 | 10/2002 | Philipp | |
| 6,516,672 B2 | 2/2003 | Wang | |
| 6,529,017 B2 | 3/2003 | Martin et al. | |
| 6,961,015 B2 | 11/2005 | Kernahan et al. | |
| 7,148,697 B2* | 12/2006 | Doljack | 324/548 |
| 7,254,775 B2 | 8/2007 | Geaghan et al. | |
| 7,260,796 B2 | 8/2007 | Suaya et al. | |
| 7,380,891 B2* | 6/2008 | Ohashi et al. | 303/199 |
| 2002/0008526 A1 | 1/2002 | Martin et al. | |
| 2002/0116696 A1 | 8/2002 | Suaya et al. | |
| 2004/0255674 A1 | 12/2004 | Steiger et al. | |

(Continued)

OTHER PUBLICATIONS

U.S. Appl. No. 11/612,799, filed Dec. 19, 2006, entitled "Touch Sensor with Electrode Array".
U.S. Appl. No. 61/017,451, filed Dec. 28, 2007, entitled, "Multiple Capacitance Measuring Circuits and Methods".

*Primary Examiner*—Jeff Natalini
(74) *Attorney, Agent, or Firm*—Steven A. Bern (57) ABSTRACT

Capacitance measuring circuits and methods apply electrical charge pulses to ramp voltage signals across a voltage threshold, and use the number of pulses to determine the capacitance. Capacitances at multiple locations can be measured by storing a pulse counter value in a register associated with each voltage signal channel as that voltage signal crosses the threshold. Effects of electrode resistance on the capacitance measurements can be mitigated by using charge pulses to ramp the voltage signals and waiting for signal quiescence between pulses.

17 Claims, 5 Drawing Sheets

U.S. PATENT DOCUMENTS

| | | |
|---|---|---|
| 2005/0268260 A1 | 12/2005 | Suaya et al. |
| 2007/0074913 A1 | 4/2007 | Geaghan |
| 2007/0107492 A1 | 5/2007 | Lasalandra et al. |
| 2007/0143059 A1 | 6/2007 | Moser |
| 2008/0142281 A1 | 6/2008 | Geaghan |
| 2008/0252608 A1 | 10/2008 | Geaghan |

* cited by examiner

PULSED CAPACITANCE MEASURING CIRCUITS AND METHODS

This patent document claims the benefit, under 35 U.S.C. §119(e), of U.S. Provisional Patent Application No. 61/017,451, entitled "Multiple Capacitance Measuring Circuits and Methods" as was filed on Dec. 28, 2007, which document is fully incorporated herein.

The present invention relates generally to circuits and methods for measuring capacitances using pulses, and in particular to varying pulse timing to accommodate circuit resistance, and to incrementally ramping signals to a threshold.

BACKGROUND

Touch sensitive devices allow a user to conveniently interface with electronic systems and displays by reducing or eliminating the need for mechanical buttons, keypads, keyboards, and pointing devices. For example, a user can carry out a complicated sequence of instructions by simply touching an on-display touch screen at a location identified by an icon. In many touch sensitive devices, the input is sensed when a conductive object in the sensor is capacitively coupled to a conductive touch implement such as a user's finger. Such devices measure capacitance at multiple locations due to the touch disturbance, and use the measured capacitances to determine touch position.

SUMMARY OF THE INVENTION

In certain embodiments, the present invention provides methods for use in devices that measure capacitances at each of a plurality of locations by applying an electrical charge to ramp respective voltage signals associated with each of the locations. Such methods include incrementally ramping the respective voltage signals using a series of electrical charge pulses to charge each of the capacitances until each of the ramped voltage signals cross a threshold voltage level. The methods include, for each pulse, incrementing a pulse count value, and storing the pulse count value in registers associated with any of the voltage signals determined to have crossed the threshold voltage level after waiting for quiescence in the voltage signals. The methods further include determining the capacitances using the count values stored in the associated registers.

In certain embodiments, the present invention provides methods for use in devices that measure capacitance of an electrode by applying an electrical charge to the electrode through an electrode resistance to thereby ramp a voltage signal, where the methods include accumulating clock cycle counts during an initial ramping of the voltage signal from a first reference level to a second reference level, incrementally ramping the voltage signal using a series of electrical charge pulses to charge the capacitance until the voltage signal crosses a threshold voltage level, where for each pulse a pulse count value is incremented and voltage signal quiescence is achieved before initiating another pulse. The capacitance can be determined using the accumulated clock cycle counts and the pulse count value.

In certain embodiments, the present invention provides devices that measure capacitances at each of a plurality of locations by applying an electrical charge to ramp respective voltage signals associated with each of the locations. Such devices include a ramp control circuit to incrementally ramp the voltage signals using a series of electrical charge pulses, a pulse counter to increment a pulse count value after each electrical charge pulse, and a plurality of registers, each register associated with one of the voltage signals to store the pulse count value when the associated voltage signal is determined to have crossed the threshold voltage level after waiting for voltage signal quiescence. The capacitances can be determined using the stored pulse count values.

In certain embodiments, the present invention provides methods of mitigating effects of electrode resistance on capacitance measurements for use in devices that measure capacitance of an electrode by applying an electrical charge to the electrode through an electrode resistance. Such methods include using a series of pulses to charge the capacitance and ramp a resulting voltage signal to a threshold voltage level, waiting between each pulse for quiescence in the voltage signal voltage, and determining the capacitance using the number of pulses needed for the voltage signal to reach the threshold voltage level.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

BRIEF DESCRIPTION OF THE DRAWINGS

The present disclosure may be more completely understood and appreciated in consideration of the following detailed description of various embodiments in connection with the accompanying drawings, in which.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF EMBODIMENTS

In the following description of the illustrated embodiments, reference is made to the accompanying drawings which form a part hereof, and in which is shown by way of illustration, various embodiments in which the invention may be practiced. It is to be understood that the embodiments may be utilized and structural changes may be made without departing from the scope of the present invention.

In certain embodiments, the present disclosure is directed to capacitance measuring circuits and methods that apply electrical charge pulses to ramp voltage signals across a voltage threshold, and that use the number of pulses to determine the capacitance. Capacitances at multiple locations can be measured by storing a pulse counter value in a register associated with each voltage signal channel as that voltage signal crosses the threshold. Effects of electrode resistance on the capacitance measurements can be mitigated by using charge pulses to ramp the voltage signals and waiting for signal quiescence between pulses. Circuits and methods of the present invention are particularly suited for use with capacitance measurement systems, including multiple capacitance measurement systems, such as touch sensors that include multiple sensing electrodes and/or multiple drive circuits. In certain embodiments of the present invention, measuring capacitances using pulsed currents is tolerant of electrode resistances in the measurement channels.

Methods and circuits of the present invention can be implemented by applying a pulsed current or voltage, resulting in a stepped ramp. For example, U.S. Pat. No. 6,466,036 discloses a circuit that pulses voltage onto a series combination of a known capacitor and an unknown capacitance. The known capacitor is discharged between pulses then re-charged with each pulse, while the unknown capacitance accumulates the charge of all pulses, resulting in an incrementally stepped voltage ramp on the unknown capacitance. After a number of pulses, voltage on the unknown capacitance reaches a fixed threshold. The number of pulses required to reach the threshold is approximately proportional to the ratio of the known capacitance and the unknown capacitor. Co-assigned U.S. patent application Ser. No. 11/612,790, incorporated herein by reference, discloses circuits for generating an incrementally stepped voltage ramp on an unknown capacitance by transferring charge alternately through two known capacitances.

Without loss of generality, and for the purpose of efficient illustration, it is useful to describe various aspects of the present invention in terms of touch sensor system environments. It will be recognized, however, that such descriptions are merely exemplary and not limiting, and that aspects of the present invention can be suitably implemented in many applications where capacitances are measured, and where relative magnitudes or ratios of measured capacitances are calculated. Examples include instruments, pressure gauges, and measurement of small distances, areas, and moisture.

Figure 1A:
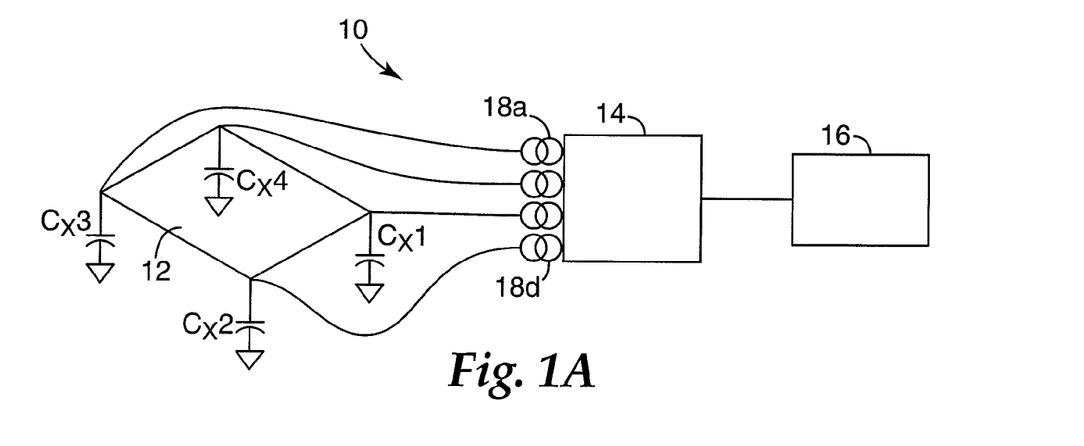
FIGS. 1A through 1C schematically show exemplary touch sensor systems useful in certain embodiments of the present invention.
Figure 1B:
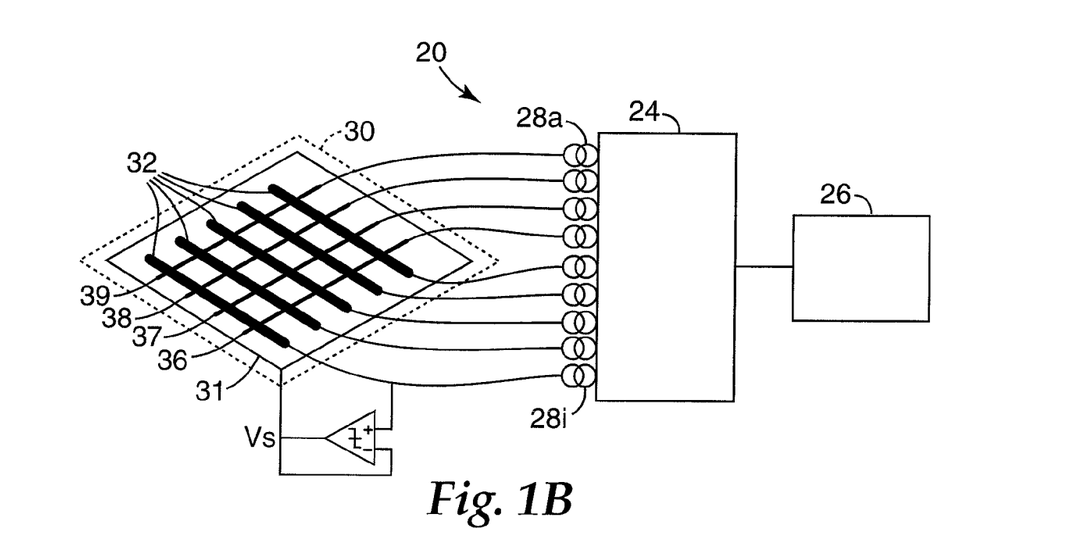
Figure 1C:
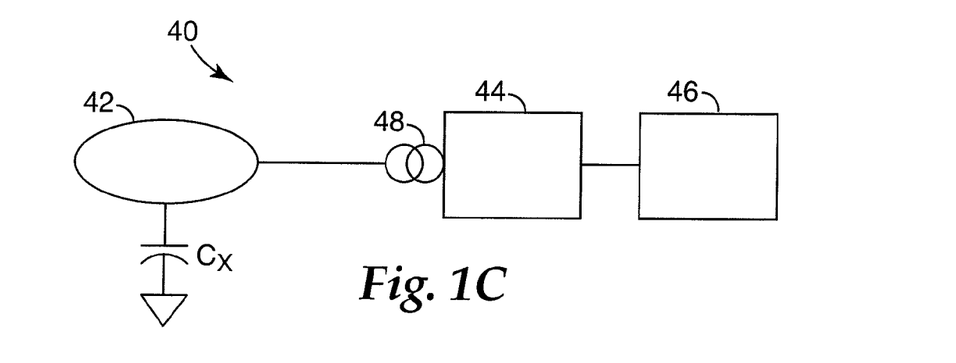

FIGS. 1A through 1C illustrate touch sensor examples of capacitance measurement devices suitable for implementing various embodiments of the present invention. In certain applications, the devices shown determine information related to a touch object coupled to a sensor surface by measuring capacitance, or relative capacitance, at one or more locations on the sensor surface due to the presence of the touch object. For example, device 10 in FIG. 1A represents a 4-wire capacitive sensor system (also called analog capacitive) in which capacitances $C_x1$ through $C_x4$, shown located at the corners of sensor 12, are measured by controller 14. Sensor 12 can be a continuous resistive layer (such as the capacitive touch sensors commercially available from 3M Touch Systems, Inc. under the trade designation Cleartek), a patterned or segmented resistive layer (such as sensors disclosed in co-assigned U.S. Ser. No. 11/734,553, filed on Apr. 12, 2007, which is hereby fully incorporated into this document), or any other suitable sensor. As another example, device 20 in FIG. 1B represents a matrix capacitive sensor system that includes orthogonal sets of electrodes, and a controller 24 that measures the capacitance on each of the electrodes (such as disclosed in U.S. Pat. Publication 2007/0074913, which is hereby fully incorporated into this document). Embodiments of the present invention can also be used to measure capacitance for button and switch applications (individually or in an array), for linear slider controls, and so forth. For example, device 30 in FIG. 1C represents a capacitive button sensor system 30 that includes a sensing surface 32 and a controller 34 that measures the capacitance of the sensor surface.

As indicated, system 10 in FIG. 1A shows a 4-wire touch embodiment, including a touch controller 14 coupled to a microprocessor 16 and to an analog capacitive sensor 12. In exemplary embodiments, controller 14 performs functions such as touch signal conditioning, data conversion, and real-time processing, while microprocessor 16 performs functions such as filtering and touch coordinate calculation. Controller 14 drives sensor 12 at the capacitance measurement locations using current sources 18a through 18d. When a conductive touch object is coupled to sensor 12, the resulting capacitance is measured at each corner, represented by lumped capacitances $C_x1$ through $C_x4$. For ease of illustration, exemplary embodiments are described herein in terms of current drive circuits.

As indicated, system 20 in FIG. 1B shows a matrix touch sensor embodiment, including a touch controller 24 coupled to a microprocessor 26 and to matrix capacitive sensor 30. In exemplary embodiments, controller 24 performs functions such as touch signal conditioning, data conversion, and real-time processing, while microprocessor 26 performs functions such as filtering and touch coordinate calculation. As shown in FIG. 1B for the purposes of illustration, controller 24 drives sensor 30 via nine current sources 28a through 28i, each current source coupled to a different sensing electrode. The electrodes are arranged as orthogonal sets of linear bars, including bottom electrodes 32 and top electrodes 36 through 39. A parasitic capacitance (not indicated) couples bottom electrodes 32 to ground and top electrodes 36 through 39 to ground. There can also be a mutual capacitance (not indicated) that couples each of bottom electrodes 32 to adjacent bottom electrodes, and each of bottom electrodes 32 to each of top electrodes 36 through 39. In certain embodiments, sensor 30 includes an electrically conductive shield 31 to mitigate currents that might otherwise flow due to parasitic capacitances. Shield 30 may be connected to a fixed voltage (not indicated) or it may be driven with an AC electrical signal Vs, which can for example be approximately equal to the voltage signals applied to electrodes 32. Reducing the AC voltage difference between shield 31 and electrodes 32, and between shield 31 and electrodes 36 through 39, reduces capacitive currents that may flow through mutual (parasitic) capacitances. This is desirable because parasitic capacitance tends to reduce sensitivity to changes in touch capacitance.

As indicated, system 40 in FIG. 1C shows a capacitive button embodiment, including a touch controller 44 coupled to a microprocessor 46 and to a sensor surface 42. In exemplary embodiments, controller 44 performs functions such as touch signal conditioning, data conversion, and real-time processing, while microprocessor 46 performs functions such as filtering and touch coordinate calculation. Controller 44 drives sensor surface 42 using current source 48. When a conductive touch object is coupled to sensor 42, the resulting capacitance $C_x$ is measured. As noted above, system 40 can be implemented using the current drive circuit shown as well as using voltage drive circuits. $C_x$ is a combination of parasitic capacitance and touch capacitance.

Figure 2:
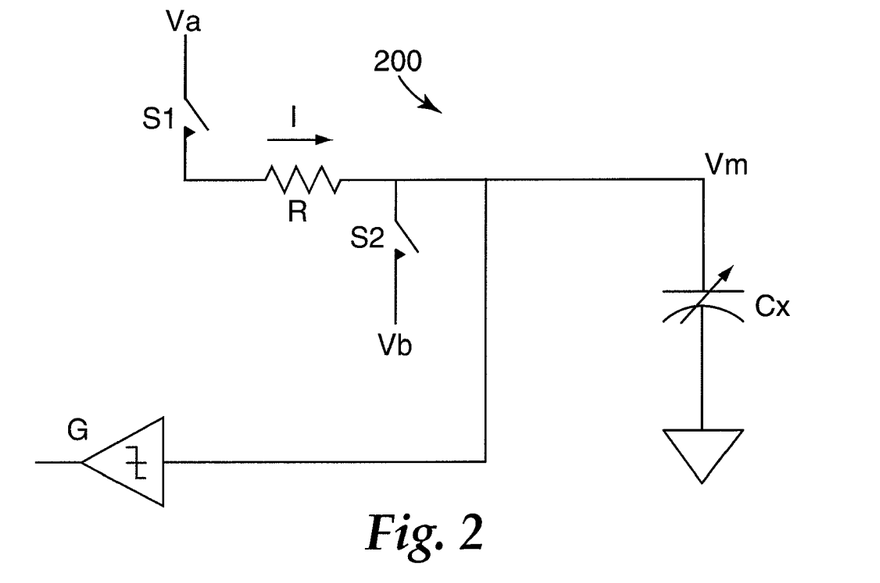
FIG. 2 schematically shows an exemplary circuit for providing a pulsed current for capacitance measurement in accordance with certain embodiments of the present invention.

Circuit 200 shown in FIG. 2 illustrates an example of a circuit that can be used in certain embodiments to provide pulsed current to an unknown capacitance for measuring the capacitance. Circuit 200 includes two switches, S1 and S2, for connecting capacitance $C_x$ to voltages Va and Vb, respectively. For example, voltage Va can be equal to a voltage Vcc (e.g., 5 V), and voltage Vb can be ground. When switch S1 is closed and switch S2 is open, capacitance $C_x$ is connected to voltage Va through resistor R, thereby charging capacitance $C_x$ with current I. When switch S1 is open and switch S2 is closed, the capacitance $C_x$ is discharged to level Vb, for example ground. As shown, a comparator G is used to produce a trigger when voltage signal Vm reaches a threshold. The trigger can be used to switch between charging and discharging modes, for example. Circuit 200 can be constructed using external switches, or alternatively from two standard parallel input/out (PIO) ports and an external resistor. For example, switch S1 can be the pull-up FET of a PIO port, and switch S2 can be the pull-down FET of a second PIO port.

During charging (S1 closed, S2 open), capacitance $C_x$ will charge with an R-C time constant $R \times C_x$. When voltage signal Vm reaches the switching threshold of comparator G, the trigger can be used to stop the charging cycle. The time elapsed during charging is proportional to the capacitance $C_x$, and given a known R, $C_x$ can be calculated. In addition, changes in $C_x$ result in proportional changes in charging time. After the voltage threshold is reached, S1 may be opened and S2 closed to discharge $C_x$ to ground, for example, in preparation for another charging cycle.

For touch panel applications, typical touch capacitances can be on the order of 1 to 20 pf, while parasitic capacitances in the same systems can range from 20 pf to more than 2000 pf. In measuring charging times, practical considerations can limit the time resolution to about 40 nsec. As such, a charging cycle time of greater than 40 μsec is desirable to be able to achieve desired measurement resolutions (0.1%) given that very small changes in capacitance are being measured in the presence of relatively large noise. Given that the threshold voltage signal Vth=½ Va, the R-C time constant $R \times C_x$ should be greater than 50 μsec=200 pf×R. Thus, R=250 KΩ may be the minimally required. Similarly, if 2 pf touch signals were to be measured in the presence of 2000 pf parasitic capacitances, 0.01% resolution would be needed, so R=2.5 MΩ.

Circuit 200 can be operated by pulsing switch S1 on and off during the charging time rather than leaving S1 closed. By pulsing switch S1, resistor R is seen by the circuit as having an effective value that is inversely proportional to the duty cycle of S1 pulses. As such, the effective resistance of R can be changed under program control to provide the desired measurement resolution. An example time sequence for pulsed operation of circuit 200 is given by: (1) S2 closed to reset $C_x$ to 0V; (2) reset a pulse counter; (3) close switch S1 for a pulse period, and then open switch S1; (4) increment the pulse counter; (5) test whether the comparator threshold trigger has changed from low to high; (6) if the test is affirmative, store the value in the counter and end; (7) if the test is not affirmative, repeat starting at step (3). The stored value of the counter can be used to determine the capacitance $C_x$. Steps (1) through (7) can be repeated as many times as desired, for example to achieve a certain measurement resolution. Example values for such circuit operation are given by: R=1 MΩ; pulse duration in step (3)=200 nsec; measurement loop duration for steps (3) through (5)=1 μsec; number of pulses to achieve 0.1% resolution=1000; and total measurement time=1 msec.

For systems having multiple circuits such as circuit 200 to measure multiple capacitances concurrently, similar steps can be performed. In certain embodiments, a single pulse counter can be used, and as each respective circuit's comparator triggers due to its voltage threshold being reached, the value in the counter can be stored in a register associated with that circuit. The steps are repeated until the threshold is reached on all the circuits' voltage signals.

While circuit 200 is described with Va=Vcc and Vb=ground, the situation can be reversed so that Va=ground and Vb=Vcc. In this case, the voltage signal ramps would start at Vcc (instead of 0 V) and ramp toward ground (instead of toward Vcc), but the basic functions are unchanged. In some embodiments, ramping starting from an elevated voltage level may be desirable, particularly when switch S1 is pulsed using a PIO pull-down FET, with the function of switch S2 performed by configuring the PIO as an open-collector when open switch S2 is desired.

In some embodiments, it may be desirable to alternate between ramping from an elevated voltage and ramping from ground. Averaging results from alternate $C_x$ measurements can thus reduce the effects of low frequency noise.

In addition to or alternative to charging the capacitance using a pulsed current, a constant current charging phase can be used, for example to more quickly ramp the voltage signal to a level desired for pulsing.

Figure 3:
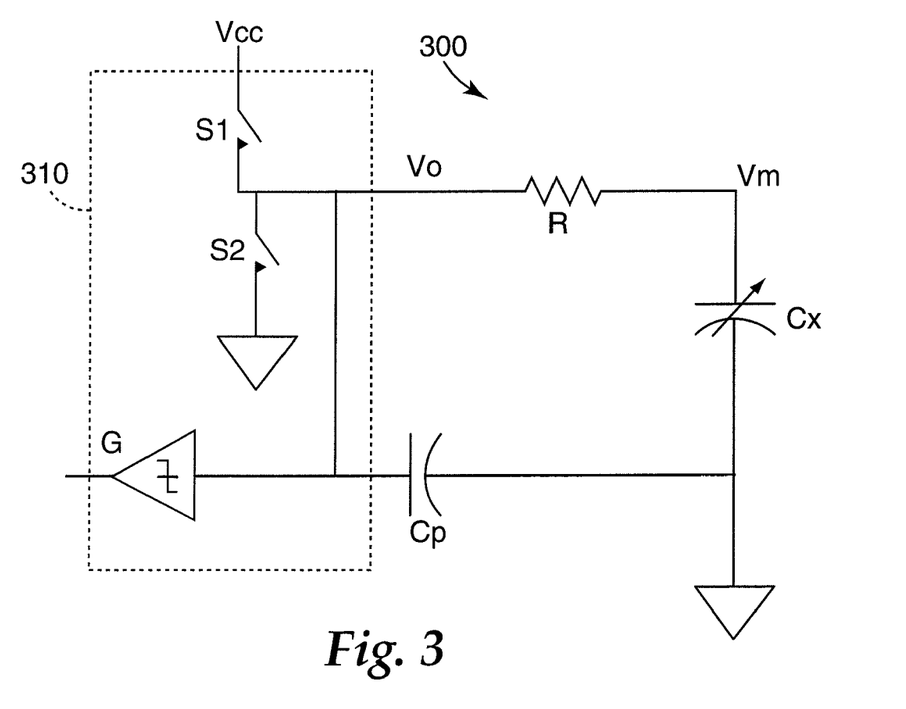
FIG. 3 schematically shows an exemplary circuit for providing a pulsed current for capacitance measurement in accordance with certain embodiments of the present invention.

Circuit 300 shown in FIG. 3 illustrates another example circuit that can be used in certain embodiments to provide pulsed current to an unknown capacitance for measuring the capacitance. Circuit 300 can be implemented using a single PIO port, and thus for the sake of illustration on-chip elements are shown in box 310, with the other elements being provided either externally or on-chip. Circuit 300 has two switches, S1 and S2, to connect capacitance $C_x$ to Vcc or ground, respectively. Both switches S1 and S2 connect to capacitance $C_x$ through resistor R, disposed between node Vo and voltage signal Vm. Parasitic capacitance $C_p$ includes PIO circuit capacitance and interconnects from R to the PIO. Typical magnitudes of $C_p$ are on the order of 10 pf. Circuit 300 also includes a comparator G, similar to circuit 200 in FIG. 2.

Circuit 300 can operate using the same sequence as described for circuit 200. Additional considerations in operating circuit may include: during the reset step, closing switch S2 long enough to discharge $C_x$ through the high resistance R; and if the parasitic capacitance, $C_p$, at node Vo is significant relative to $C_x$, allowing sufficient time between pulses so that $C_p$ can dissipate through R into $C_x$.

In certain embodiments, circuit 300 (and, analogously, circuit 200) is operated by alternating positive current ramps (e.g., pulsing switch S1) and negative current ramps (e.g., pulsing switch S2), which can help reduce the effects of low frequency noise. An example time sequence for pulsed operation of circuit 300 is given by: (1) Switch S2 closed to reset $C_x$ to 0 V; (2) reset the pulse counter; (3) close switch S1 for a pulse period, and then open switch S1; (4) increment the pulse counter; (5) test whether the comparator threshold trigger has changed from low to high; (6) if the test is affirmative, store the value of the counter into a memory location (Mp) and end the positive ramp by going to step (8); (7) if the test is not affirmative, repeat starting at step (3); (8) Switch S1 is closed to reset all $C_x$ to Vcc; (9) reset the pulse counter; (10) close switch S2 for a pulse period, and then open switch S2; (11) test whether the comparator threshold trigger has changed from high to low; (12) if the test is affirmative, store the value of the counter into another memory location (Mn) and end the negative ramp; (13) if the test is not affirmative, repeat starting at step (10); (14) combine the values stored in memory locations Mp and Mn, for example by averaging them together. The steps (1) through (14) can be repeated a desired number of times to achieve a result with improved noise immunity to low frequencies and to leakage currents in switches S1 and S2.

Figure 4A:
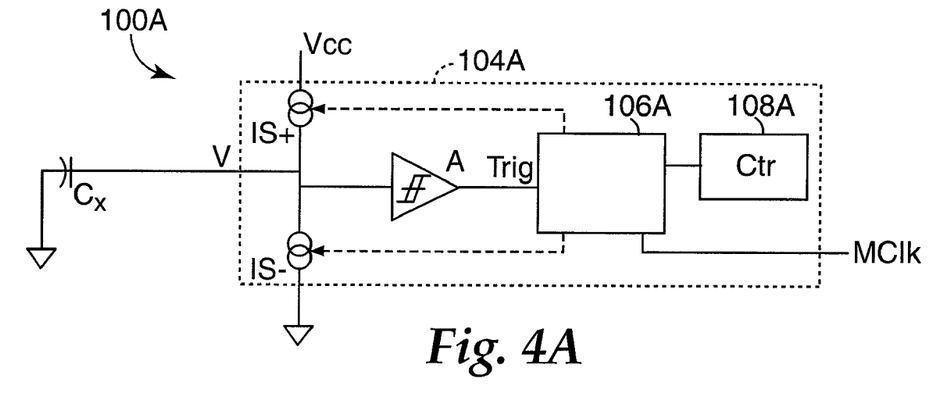
FIGS. 4A and 4B schematically show portions of exemplary control circuits useful in certain embodiments of the present invention.

FIGS. 4A and 4B show exemplary current drive circuits 100A and 100B, which can be used to drive one or more electrodes on sensor surfaces and/or one or more measurement locations on an electrode of a sensor surface. In FIG. 4A, converter 104A generates positive and negative voltage ramp signals by injecting positive and/or negative pulsed currents from current sources IS+ and IS− into capacitance $C_x$. Converter 104A includes a comparator A that provides a trigger Trig to control logic 106A when a voltage threshold is reached. The capacitance $C_x$ can be correlated to the accumulated ramp times and/or number of ramp pulses required to complete various ramping cycles. The counter 108 (also denoted Ctr) can be used to increment the clock cycle counts and/or pulse counts. The low and high voltage thresholds (denoted herein −Vth and +Vth) can be used as the switching points of hysteresis comparator A (Schmitt trigger). Ramp signal V is generated by pulsing the forward and reverse current generators IS+ and IS− at a desired rate. When IS+ is pulsed, current pulses flow into $C_x$, generating a step-wise increasing voltage signal ramp. Ramping cycles can be alternated and repeated a desired number of times depending on required measurement resolution, response times, and so forth.

Figure 4B:
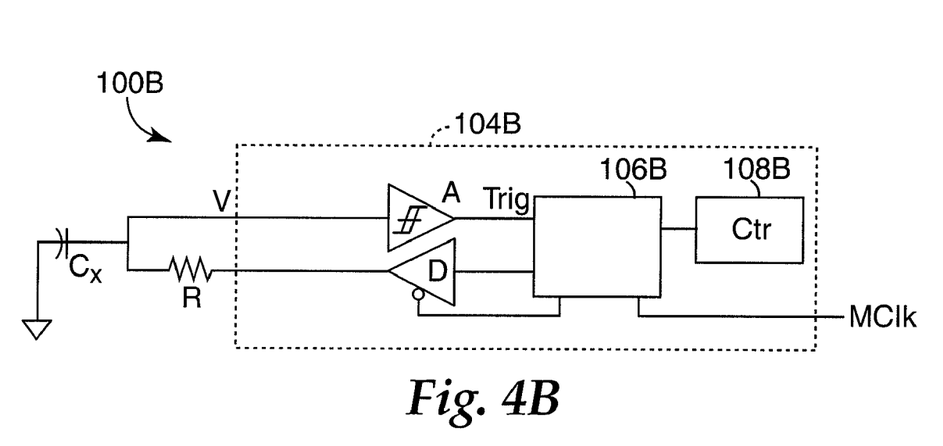

FIG. 4B shows another exemplary drive circuit 100B that includes a converter 104B that has a comparator A providing a trigger signal Trig to control logic 106B that regulates stopping and starting of a counter 108B, much like the converter 104A shown in FIG. 4A. Drive circuit 100B additionally includes a tri-state driver D and a resistor R, which replace the current sources IS+ and IS− shown in the converter 104A of FIG. 4A, to generate currents into capacitor $C_x$. Circuit 100B can be implemented with simple switches rather than analog current sources in the controller.

Figure 5:
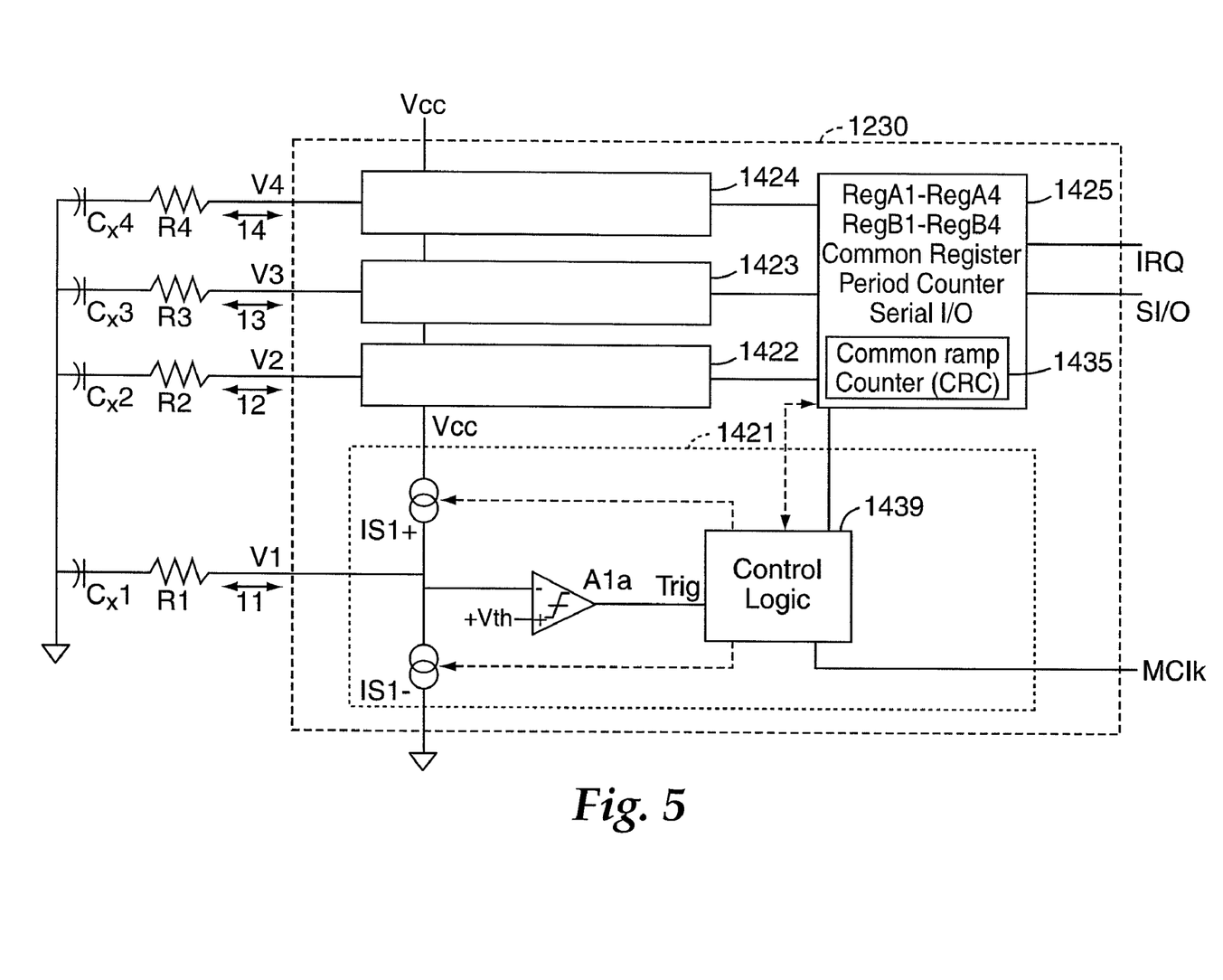
FIG. 5 schematically shows an exemplary control circuit useful in certain embodiments of the present invention.

FIG. 5 exemplifies a controller 1230 having four drive circuits 1421 through 1424, which are respectively used to measure capacitances $C_x1$ through $C_x4$, for example at different locations on a sensor surface of a 4-wire analog capacitive touch sensor, or on four of the electrodes of a matrix capacitive touch sensor. As shown, drive circuits 1421 through 1424 are each analog-to-digital converters similar to the converter 104A shown in FIG. 4A. It will be appreciated that converters such as shown in FIG. 4B can be used, as well as voltage drive circuits. Although only converter 1421 is shown in detail in FIG. 5, it will be appreciated that each of converters 1422, 1423 and 1424 include corresponding components. In the general case, separate measurement channels are used for each capacitance measurement location, which in the case of a matrix touch sensor may be equivalent to the number of individual electrodes (e.g., sixteen measurement locations for an eight-by-eight electrode matrix).

The converters 1421 through 1424 are each configured to generate forward (+) and reverse (−) pulsed ramp signals by alternately injecting forward direction and reverse direction pulsed currents from current sources into capacitances $C_x1$ through $C_x4$. For example, converter 1421 includes current sources IS1+ and IS1− (and, although not indicated, by consistent nomenclature, converter 1422 includes current sources IS2+ and IS2−, converter 1423 includes current sources IS3+ and IS3−, converter 1424 includes current sources IS4+ and IS4−, with IS+ and IS− being used herein to indicate any or all of the current sources as indicated by context). In exemplary embodiments, the current sources are equal in magnitude so that IS1+=IS1−=IS2+=IS2−=IS3+=IS3−=IS4+=IS4−. Converter 1421 also includes a comparator A1a that provides a trigger to control logic 1439 when a threshold is reached. High and low triggers can be provided based on high and low thresholds. Each converter similarly includes a comparator.

Assuming that the measured capacitances are also equal, that is $C_x1=C_x2=C_x3=C_x4$, then the voltage signals V1, V2, V3, and V4 will have ramps of equal slope. For analog capacitive touch panel applications, $C_x1$ through $C_x4$ are typically close in value (for example, within about 30% of one another). For many matrix capacitive sensor measurements, it is common to use the 3 to 5 highest capacitance electrodes in each dimension and the others can be ignored as sufficiently close to zero. A touch input to the sensor generally will have the effect of increasing one (or more) of the capacitances relative to the others, resulting in a slower ramp on the voltage signal of the channel having the greater capacitance. Differences in slopes result in differences in time required to ramp to a threshold voltage level (for example up from a low reference level such as ⅓ Vcc, or down from a high reference level such as ⅔ Vcc). The accumulated ramp times for the voltage signals V1 through V4 are measured concurrently, and the measured differences between the accumulated ramp times are used to indicate the differences in capacitance among $C_x1$ through $C_x4$.

Ramp signals V1 through V4 are generated by turning on forward and/or reverse current generators, such as IS1+ and IS1−, and pulsing at a desired rate. With reference to converter 1421, when IS1+ is pulsed, current pulses flow into $C_x1$, generating a step-wise increasing voltage signal ramp. Unless prematurely terminated, the V1 signal will ramp up until comparator A1a triggers at +Vth. At that point, IS1+ turns off. In certain embodiments, voltage signal ramp downs can be performed by pulsing IS1− until comparator A1a is triggered at the appropriate threshold. In certain embodiments, alternating ramp up and ramp down cycles can be performed between high and low voltage thresholds to achieve capacitance measurements. Alternating ramp up and ramp down cycles can also be performed to ramp the signals above and below a single threshold, as discussed in more detail with respect to FIGS. 6 and 7. The ramping cycles can be alternated and/or repeated a desired number of times depending on required measurement resolution, response times, and so forth. Each of the timed-slope converters is connected to circuitry 1425 that can include a microcontroller, memory, and programmed algorithms to execute the processes described herein. Serial I/O ports (SI/O) and an interrupt request port (IRQ) may be coupled to a microprocessor or computer (not shown), for example.

Figure 6:
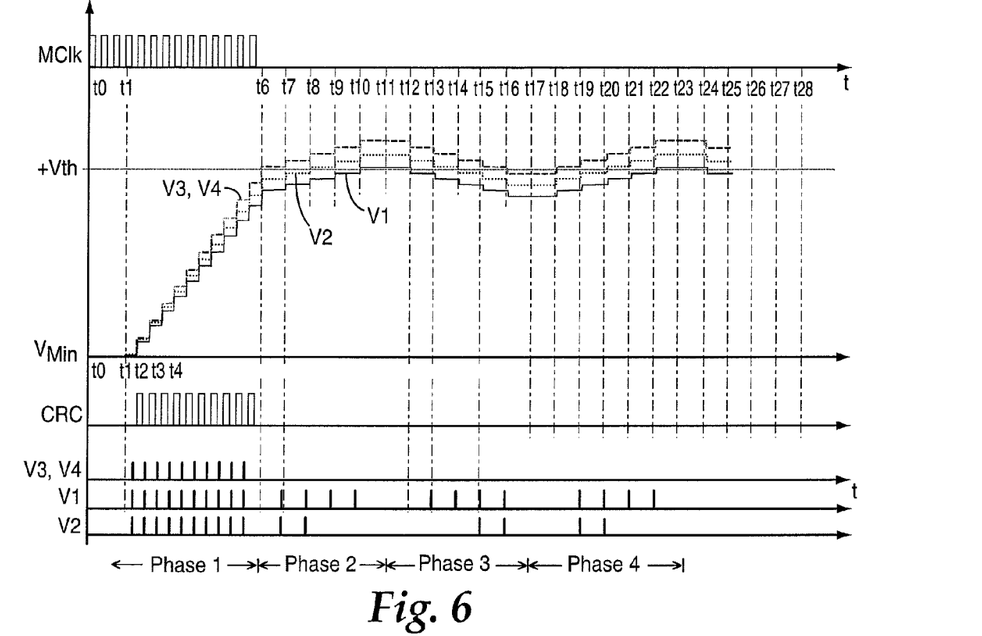
FIG. 6 schematically shows a timing diagram indicating operation of a multiple capacitance measurement circuit in accordance with certain embodiments of the present invention.

FIG. 6 indicates a time sequence for an example circuit operation that can be generated by the circuit shown in FIG. 5. In the case of FIG. 6, the resistances R1-R4 are considered to be negligibly small. During the first phase, the voltage signals V1 through V4 are pulsed relatively rapidly from Vmin to +Vth as follows. At time t1, equal current sources IS1+ through IS4+ are pulsed on for a fixed duration, resulting in currents I1 through I4 flowing through (negligibly small) resistances R1 through R4 into $C_x1$ through $C_x4$, respectively.

V1 and V2 ramp up in a step-wise fashion with each pulse of current at a rate proportional to $I1/C_{x1}$ and $I2/C_{x2}$ respectively. Voltage signals V3 and V4 each ramp at a rate inversely proportional to their respective $C_x$'s, which in this case are assumed to be equal. V1, V2, and V3-V4 ramps diverge, as they step incrementally from $V_{Min}$ toward Vth, indicating that capacitance $C_{x1}$ is larger than $C_{x2}$, which in turn is larger than capacitances $C_{x3}$ and $C_{x4}$. Common ramp counter 1435 (CRC) accumulates main clock counts during the phase 1 ramping from time t1 to time t6, where t6 is the next rising clock edge after the first of signals V1 through V4 crosses +Vth. At that point, CRC stops accumulating, and all current sources IS1+ through IS4+ are turned off.

At time t6, the phase 1 ramping is completed, and the value of CRC (10 main clock counts in this example) is stored into a common register CRC. The value stored in register CRC represents a minimum common value of capacitance among the measurement channels. Subsequent measurements may then be added to RegCRC to yield total capacitance values.

During phase 2, ramping occurs as follows. Note that the time scale in FIG. 6 changes at time t6, and as such the MClk cycles are no longer indicated. Voltage signals V1 through V4 are tested to determine which if any of the signals is still below the threshold +Vth. For example, at each of times t7, t8, t9, t10, t11, t12, t13 and t14, the signals are tested. For each voltage signal that is determined to remain below +Vth, a register value associated with that voltage signal can be incremented (e.g., RegA1 through RegA4 indicated in FIG. 5). Once a voltage signal crosses +Vth, its associated register value is no longer updated for the remainder of the phase. Registers can be incremented by saving the value accumulated in a pulse counter, or common register, that increments with each new pulse. After testing, each of the current sources IS1+ through IS4+ are pulsed on for a predetermined period and then turned off again. Another test occurs after waiting for signal quiescence. The current from sources IS1 through IS4, multiplied by the on duration of current pulses results in a known quantity of charge applied to each of $C_{x1}$ through $C_{x4}$ during each pulse. Current levels and/or pulse durations may be adjusted so each pulse increments V1 through V4 by a desired amount. This amount may be sized such that a touch capacitance on at least one channel will cause a change of 5 to 50 or more pulses between the touched and non-touched states.

When testing reveals that all of the signals V1 through V4 have gone above +Vth, phase 2 ramping is completed. In FIG. 6, this occurs at time t11. At the end of phase 2 ramping, the capacitances $C_{x1}$ through $C_{x4}$ can be determined using the common value accumulated in the counter CRC during phase 1 ramping, and the values stored in each of the registers RegA1 through RegA4. For example, the value in RegA1 can be added to the valued in CRC to yield a total ramping value that is proportionate to $C_{x1}$, which is 14 in this example. The value in RegA2 can be added to the value in CRC to yield a total ramping value that is proportionate to $C_{x2}$ (12 in this example). The value in RegA3 can be added to the value in CRC to yield a total ramping value that is proportionate to $C_{x3}$ (10 in the example), and the value in RegA14 can be added to the valued in CRC to yield a total ramping value that is proportionate to $C_{x4}$, (a value of 10).

Absolute capacitance values are calculable after phase 2. Calculated capacitance values can be refined and/or adjusted by repeating phases 1 and 2 in the same or opposite ramping directions, or can be refined and/or adjusted by continuing to measure relative changes in capacitance over additional pulsed ramping cycles. For many touch sensor systems, and in particular matrix touch sensor systems, relative capacitance values and/or changes in capacitance values relative to a baseline are all that is needed.

Phases 3 and 4 in FIG. 6 exemplify pulsed ramping back and forth across a threshold, in this case the threshold +Vth, which was crossed by all the channels by time t11. Phase 3 proceeds much like phase 2, except that the current pulses are negative currents, for example from sources IS−, and ramping ends when all the signal channels have gone below the threshold +Vth. Phase 4 proceeds by pulsing positive currents until all the signal channels have gone back above the threshold +Vth. The number of pulses required for a given signal channel to cross the threshold during a phase is stored in a register associated with that signal channel. In certain embodiments, a different register can be used during the relative capacitance measurement phases than in the absolute capacitance measurement phases. For example, during phases 3 and 4, the values in registers RegA1 through RegA4, which at the end of phase 2 were related to absolute capacitance, can be retained. As such, each signal channel can be associated with another register, for example registers RegB1 through RegB4, that will contain relative capacitance values, which can be determined as follows.

At time t12, equal negative currents from sources IS1− through IS4− are pulsed on for a short period (e.g., about 50 to 100 nSec) so that currents I1 through I4 flow into $C_{x1}$ through $C_{x4}$ respectively. The voltage signals are allowed to settle into quiescence at new levels that are incrementally lower than they were at time t12. The incremental change in voltage caused by the current pulse in a given channel is inversely proportional to the capacitance being measured by that channel. Prior to the next pulse at time t13, the voltage signal levels are tested relative to +Vth, and for any channel still above +Vth, the respective register RegB (RegB1 through RegB4) value is incremented. The same procedure is followed, measuring and incrementing one or more registers at each of times t14, t15, and t16, until the testing at time t17 indicates that all voltage signals V1 through V4 are below +Vth. At this point, phase 3 is completed, and phase 4 can be commenced.

At time t18, equal positive currents from sources IS1+ through IS4+ are pulsed on for a short period (e.g., about 50 to 100 nSec) so that currents I1 through I4 flow into $C_{x1}$ through $C_{x4}$ respectively. After the current pulses, the voltage signals are allowed to settle into quiescence at new levels that are incrementally higher than they were at time t18. The incremental change in voltage caused by the current pulse in a given channel is inversely proportional to the capacitance being measured by that channel. Prior to the next pulse at time t19, the voltage signal levels are tested relative to +Vth, and for any channel still below +Vth, the respective register RegB value is incremented. The same procedure is followed, measuring and incrementing one or more registers at each of times t20, t21, and t22, until the testing at time t23 indicates that all voltage signals V1 through V4 are above +Vth. At this point, phase 4 is completed. In the simple example, the incremental values of V1-V4 remained constant through Phase 2, 3, and 4; i.e., V1=4, V2=2, and V3=V4=0. In a typical example, the incremental values of one or more of V1 through V4 will change when sensor electrodes are touched.

The total counts in the registers RegB1 through RegB4 indicate the relative capacitance differences measured by the respective signal channels. Similar ramping can be performed as long as desirable, for example to increase measurement resolution. Absolute capacitance may be re-measured at any time by repeating the operational procedure described in phases 1 and 2 or their negative ramp equivalents. Performing phase 1 and phase 2 ramping in the same direction (i.e., both using positive currents or both using negative currents) can help reduce low frequency noise, including the effects of leakage currents from current sources IS+ and IS−.

Random noise greater than the incremental steps of the voltage signals generally has the effect of dithering the threshold levels, and as such the number of pulses required to cross and re-cross a threshold can vary, even if the level of the capacitance being measured remains constant. A large number of measurement cycles (i.e., over-sampling) can be used to average out the threshold dithering, resulting in increased measurement resolution. If sufficient noise is not present, other dithering methods may be employed to reach the same effect, for example thresholds can be varied randomly, and the pulse width of current pulses can be dithered randomly. In certain embodiments of the present invention, over-sampling is achieved by repeating the steps in phases 3 and 4 a number of times and combining the results. Results from each measurement cycle can be added to or averaged with previous measurement cycles, or can be filtered by methods such as boxcar filtering to yield updated values with increasing resolution as additional measurements are made.

Figure 7:
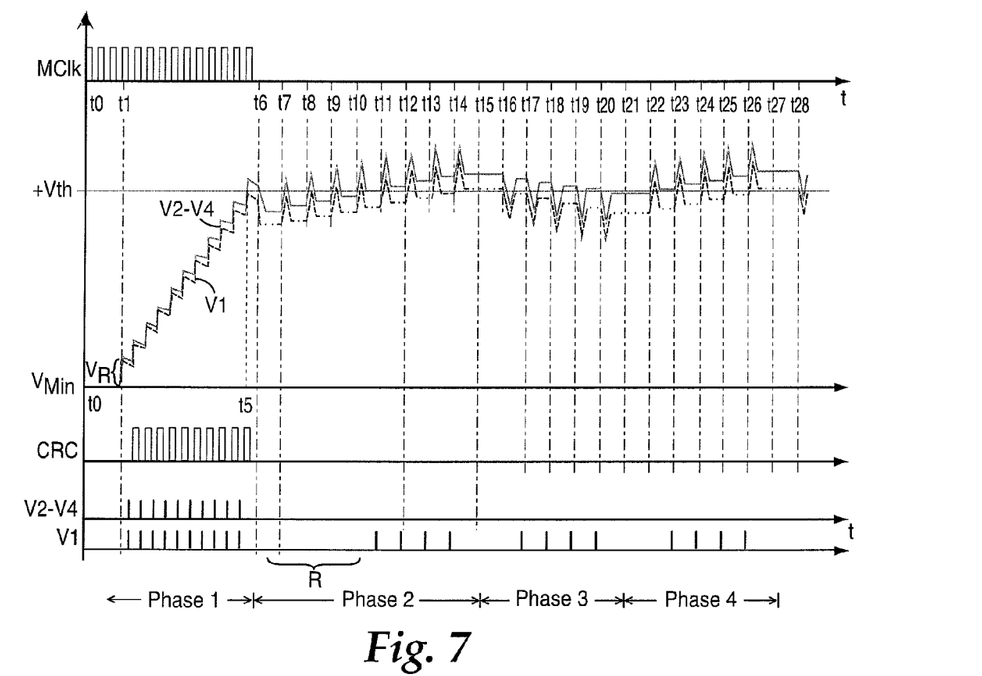
FIG. 7 schematically shows a timing diagram indicating operation of a multiple capacitance measurement circuit in accordance with certain embodiments of the present invention.

FIG. 7 indicates a time sequence for an example circuit operation that can be generated by the circuit shown in FIG. 5, when resistances R1-R4 have significant resistance. During the first phase, the voltage signals V1 through V4 are pulsed relatively rapidly from Vmin to +Vth as follows. At time t1, equal current sources IS1+ through IS4+ are pulsed on for a fixed duration, resulting in currents I1 through I4 flowing through resistances R1 through R4 into $C_{x1}$ through $C_{14}$, respectively. Voltage signals V1 through V4 step up sharply at time t1 by an amount $V_R$ due to currents flowing through resistances R1 through R4. The magnitude of $V_R$ can vary based on the magnitudes of the resistances, and in some cases $V_R$ can be adjusted to a desired level by adjusting the resistances of touch sensor electrodes or by adding resistors in series with touch sensor electrodes, for example. Electrode resistances R1-R4 are shown as discrete resistors for simplicity, but it is understood that electrode resistance, parasitic capacitance, and even touch capacitance may be distributed along the length of electrodes. The methods described with respect to FIG. 7 apply to distributed resistance and capacitance as well.

After the initial step, V1 ramps up in a step-wise fashion with each pulse of current at a rate proportional to $I1/C_{x1}$. Voltage signals V2 through V4 each ramp at a rate inversely proportional to their respective $C_x$'s, which in this case are assumed to be equal. Common ramp counter 1435 (CRC) accumulates main clock counts during the phase 1 ramping from time t1 to time t6, where t6 is the next rising clock edge after the first of signals V1 through V4 crosses +Vth (which happens at time t5). At that point, CRC stops accumulating, and all current sources IS1+ through IS4+ are turned off. Turning off the current sources causes a fast downward ramp in signals V1 through V4 as the voltages drop across resistors R1 through R4. Such downward signal level adjustment causes signals V1 through V4 to fall back below +Vth.

At time t6, the phase 1 ramping is completed, and the value of CRC (10 main clock counts in this example) is stored into a common register RegCRC. The value stored in RegCRC represents a minimum common value of capacitance among the measurement channels. Subsequent measurements may then be added to RegCRC to yield a total capacitance value.

During phase 2, ramping occurs as follows. First, after time t6, sufficient wait time is allowed so that the voltage across resistors R1 through R4 goes to near zero. Sufficient times are generally on the order of multiple average R-C time constants. In the example shown, four MClk cycles are used for the wait time to achieve signal quiescence (note that the time scale in FIG. 7 changes at time t6). The wait times can be controlled by a microprocessor, and need not be synchronized or in any way correlated with MClk. After establishing signal quiescence, the voltage signals V1 through V4 are tested (with no current flowing) to determine which if any of the signals is still below the threshold +Vth. For example, at each of times t7, t8, t9, t10, t11, t12, t13 and t14, the signals are tested. For each voltage signal that is determined to remain below +Vth, a register value associated with that voltage signal can be incremented (e.g., RegA1 through RegA4 indicated in FIG. 5). Once a voltage signal crosses +Vth, its associated register value is no longer updated for the remainder of the phase. Registers can be incremented by saving the value accumulated in a pulse counter, or common register, that increments with each new pulse. After testing, each of the current sources IS1+ through IS4+ are pulsed on for a predetermined period and then turned off again. Another test occurs after waiting for signal quiescence. The current from sources IS1 through IS4, multiplied by the on duration of current pulses results in a known quantity of charge applied to each of $C_{x1}$ through $C_{x4}$ during each pulse. Current levels and/or pulse durations may be adjusted so each pulse increments V1 through V4 by a desired amount. This amount may be sized such that a touch capacitance on at least one channel will cause a change of 5 to 50 or more pulses between the touched and non-touched states.

When testing reveals that all of the signals V1 through V4 have gone above +Vth, phase 2 ramping is completed. In FIG. 7, this occurs at time t15. At the end of phase 2 ramping, the capacitances $C_{x1}$ through $C_{x4}$ can be determined using the common value accumulated in the counter CRC during phase 1 ramping, and the values stored in each of the registers RegA1 through RegA4. For example, the value in RegA1 can be added to the valued in CRC to yield a total ramping value that is proportionate to $C_{x1}$, the value in RegA2 can be added to the valued in CRC to yield a total ramping value that is proportionate to $C_{x2}$, the value in RegA3 can be added to the valued in CRC to yield a total ramping value that is proportionate to $C_{x3}$, and the value in RegA4 can be added to the valued in CRC to yield a total ramping value that is proportionate to $C_{x4}$.

Absolute capacitance values are calculable after phase 2. Calculated capacitance values can be refined and/or adjusted by repeating phases 1 and 2 in the same or opposite ramping directions, or can be refined and/or adjusted by continuing to measure relative changes in capacitance over additional pulsed ramping cycles. For many touch sensor systems, and in particular matrix touch sensor systems, relative capacitance values and/or changes in capacitance values relative to a baseline are all that is needed.

Phases 3 and 4 in FIG. 7 exemplify pulsed ramping back and forth across a threshold, in this case the threshold +Vth, which was crossed by all the channels by time t15. Phase 3 proceeds much like phase 2, except that the current pulses are negative currents, for example from sources IS−, and ramping ends when all the signal channels have gone below the threshold +Vth. Phase 4 proceeds by pulsing positive currents until all the signal channels have gone back above the threshold +Vth. The number of pulses required for a given signal channel to cross the threshold during a phase is stored in a register associated with that signal channel. In certain embodiments, a different register can be used during the relative capacitance measurement phases than in the absolute capacitance measurement phases. For example, during phases 3 and 4, the values in registers RegA1 through RegA4, which at the end of phase 2 were related to absolute capacitance, can be retained. As such, each signal channel can be associated with another register, for example registers RegB1 through RegB4, that will contain relative capacitance values, which can be determined as follows.

At time t16, equal negative currents from sources IS1– through IS4– are pulsed on for a short period (e.g., about 50 to 100 nSec) so that currents I1 through I4 flow through resistances R1 through R4 into $C_{x1}$ through $C_{x4}$ respectively. Voltage signals V1 through V4 step down sharply after time t16, caused by the currents flowing through the resistances. After the initial downward surge, voltage signals V1 through V4 step back upward again when the current pulses end. The voltage signals are allowed to settle into quiescence at new levels that are incrementally lower than they were at time t16. The incremental change in voltage caused by the current pulse in a given channel is inversely proportional to the capacitance being measured by that channel. Prior to the next pulse at time t17, the voltage signal levels are tested relative to +Vth, and for any channel still above +Vth, the respective register RegB (RegB1 through RegB4) value is incremented. The same procedure is followed, measuring and incrementing one or more registers at each of times t18, t19, and t20, until the testing at time t21 indicates that all voltage signals V1 through V4 are below +Vth. At this point, phase 3 is completed, and phase 4 can be commenced.

At time t22, equal positive currents from sources IS1+ through IS4+ are pulsed on for a short period (e.g., about 50 to 100 nSec) so that currents I1 through I4 flow through resistances R1 through R4 into $C_{x1}$ through $C_{x4}$ respectively. After the current pulses, the voltage signals are allowed to settle into quiescence at new levels that are incrementally higher than they were at time t22. The incremental change in voltage caused by the current pulse in a given channel is inversely proportional to the capacitance being measured by that channel. Prior to the next pulse at time t23, the voltage signal levels are tested relative to +Vth, and for any channel still below +Vth, the respective register RegB value is incremented. The same procedure is followed, measuring and incrementing one or more registers at each of times t24, t25, and t26, until the testing at time t27 indicates that all voltage signals V1 through V4 are above +Vth. At this point, phase 4 is completed.

The total counts in the registers RegB1 through RegB4 indicate the relative capacitance differences measured by the respective signal channels. Similar ramping can be performed as long as desirable, for example to increase measurement resolution. Absolute capacitance may be re-measured at any time by repeating the operational procedure described in phases 1 and 2 or their negative ramp equivalents. Performing phase 1 and phase 2 ramping in the same direction (i.e., both using positive currents or both using negative currents) can help reduce low frequency noise, including the effects of leakage currents from current sources IS+ and IS–.

Random noise greater than the incremental steps of the voltage signals generally has the effect of dithering the threshold levels, and as such the number of pulses required to cross and re-cross a threshold can vary, even if the level of the capacitance being measured remains constant. Using a large number of measurement cycles (i.e., over-sampling) can be used to average out the threshold dithering, resulting in an increase in resolution. If sufficient noise is not present, other dithering methods may be employed to reach the same effect, for example thresholds can be varied randomly, and the pulse width of current pulses can be dithered randomly. In certain embodiments of the present invention, over-sampling is achieved by repeating the steps in phases 3 and 4 a number of times and combining the results. Results from each measurement cycle can be added to or averaged with previous measurement cycles, or can be filtered by methods such as boxcar filtering to yield updated values with increasing resolution as additional measurements are made.

Alternatively, phase 1 ramping as illustrated in FIGS. 6 and 7 can be generated by simultaneously starting the common ramp counter (CRC) and turning on current sources IS+, leaving the counter and current sources on until one of V1 through V4 crosses threshold +Vth. After this, the procedures described above may be executed for additional ramping phases using pulsed ramps as described above. This may result in a faster ramping during phase 1, with a corresponding reduction of resolution in the measurement of minimum common value of capacitance among the measurement channels.

It will be appreciated that, although circuit operations are described and shown in terms of bi-directional ramping (i.e., ramping up to a high threshold followed by ramping down to a low threshold, pulsed ramping back and forth across a single threshold, etc.), methods and circuits of the present invention can be implemented using unidirectional ramps such as used in the capacitance measurement circuits disclosed in U.S. Pat. No. 6,466,036, fully incorporated herein by reference. For example, in certain embodiments when the voltage signals reach or cross a threshold, the signal channels can be concurrently reset to a reference level (e.g., zero), followed by re-executing the signal ramps.

The signal ramps can be exponential, especially if relatively low resistance current sources are used such as the voltage source and resistor combination shown in FIG. 4B, so measurement results (Δcount/Δcapacitance) will not be linear over a range of capacitance. Additional linearity can be achieved if desired by varying the pulse width or pulse spacing incrementally or continuously. For example, if the ramp slope slows down by 10%, the pulse spacing may be increased by 10% so that the pulse rate tracks the ramp slope more closely.

In certain embodiments, it may be desirable to maintain each of the voltage signals at or near the same level, for example to mitigate currents flowing between capacitance measurement locations due to voltage level differences. Signals can be equalized over a series of measurements by phase adjustment, for example individually adjusting the relative starting times of subsequent signal ramps based on the results of previous ramps (noting that signal ramps for channels measuring larger capacitances will lag behind signal ramps of other channels). Alternatively or in addition to adjusting ramp start times, ramps can be adjusted by selectively omitting current pulses from one or more channels during ramping. Selecting which pulses to omit can be performed iteratively, that is by adjusting subsequent ramps based on results of previous ramps. For example, the channel measuring the largest capacitance can be used to set the total number of pulses, and pulses can be omitted from each of the other channels based on their relative capacitance differences to slow them down. Pulses can be removed in any desired manner, for example uniformly over the ramp period or randomly. The relative phase adjustment effect thus achieved is similar to that described in co-assigned provisional patent application Ser. No. 61/017,451.

As described in this document, current flow between capacitance measurement locations can be mitigated by controlling the phases of the drive signals. It will be appreciated that, for common capacitance-to-ground measurements systems such as the touch sensor systems shown in FIGS. 1A and 1B, driving the signals in phase can be used to desirably minimize mutual (inter-electrode) capacitance. In other systems, driving adjacent capacitance measurement locations out of phase can be used to enhance the measurement effect of inter-electrode mutual capacitance. For example, it can be desirable to measure, and therefore enhance, inter-electrode mutual capacitance in touch detection products that utilize shunt capacitance measurements, such as the AD7142, commercially available from Analog Devices, Inc. Phase control methods described herein may be used to adjust measurement channels to be in phase or out of phase.

The foregoing description of the various embodiments of the invention has been presented for the purposes of illustration and description. It is not intended to be exhaustive or to limit the invention to the precise form disclosed. Many modifications and variations are possible in light of the above teaching. For example, the detection methodologies described herein may be used in connection with a wide variety of touch implements, including tethered implements and implements that house a battery or other power source. It is intended that the scope of the invention be limited not by this detailed description, but rather by the claims appended hereto.

What is claimed is:

1. For use in a device that measures capacitances at each of a plurality of locations by applying an electrical charge to ramp respective voltage signals associated with each of the locations, a method comprising:
   incrementally ramping the respective voltage signals using a series of electrical charge pulses to charge each of the capacitances until each of the ramped voltage signals crosses a threshold voltage level, and for each pulse: incrementing a pulse count value and storing the pulse count value in registers associated with any of the voltage signals determined to have crossed the threshold voltage level after waiting for quiescence in the voltage signals; and
   determining the capacitances using the count values stored in the associated registers.

2. The method of claim 1, further comprising repeating the ramping step over multiple ramping cycles.

3. The method of claim 2, wherein the multiple ramping cycles alternate between ramping up the voltage signals across the threshold voltage level and ramping down the voltage signals across the threshold voltage level.

4. The method of claim 1, wherein prior to the step of incrementally ramping the voltage signals, ramping the voltage signals from a low reference voltage level to a high reference voltage level at or near the threshold voltage level.

5. The method of claim 4, further comprising storing in a common register a number of main clock cycles determined to occur during ramping from the low reference voltage level to the high reference voltage level.

6. The method of claim 5, wherein determining the capacitances comprises using the count values stored in the associated registers in combination with the number of main clock cycles stored in the common register.

7. The method of claim 4, wherein a constant current is applied to ramp the voltage signals from the low reference voltage level to the high reference voltage level.

8. The method of claim 4, wherein a pulsed current is applied to ramp the voltage signals from the low reference voltage level to the high reference voltage level.

9. The method of claim 1, wherein each of the plurality of locations is associated with one of a plurality of touch sensor electrodes.

10. For use in a device that measures capacitance of an electrode by applying an electrical charge to the electrode through an electrode resistance to thereby ramp a voltage signal, a method comprising:
    accumulating clock cycle counts during an initial ramping of the voltage signal from a first reference level to a second reference level;
    incrementally ramping the voltage signal using a series of electrical charge pulses to charge the capacitance until the voltage signal crosses a threshold voltage level, for each pulse incrementing a pulse count value and waiting for quiescence in the voltage signals before initiating another pulse; and
    determining the capacitance using the accumulated clock cycle counts and the pulse count value.

11. The method of claim 10, wherein the electrical charge pulses have a pulse duration that is less than an RC time constant associated with the capacitance and the electrode resistance.

12. The method of claim 10, wherein waiting for quiescence in the voltage signals comprises waiting for a duration that is longer than an RC time constant associated with the capacitance and the electrode resistance.

13. The method of claim 10, further comprising performing the recited steps in each of a plurality of measurement channels, each measurement channel associated with a different capacitance measurement location.

14. The method of claim 10, further comprising repeating the step of incrementally ramping the voltage signal over multiple ramping cycles.

15. The method of claim 14, wherein the multiple ramping cycles alternate between ramping up the voltage signal across the threshold voltage level and ramping down the voltage signal across the threshold voltage level.

16. A device that measures capacitances at each of a plurality of locations by applying an electrical charge to ramp respective voltage signals associated with each of the locations, the device comprising:
    a ramp control circuit to incrementally ramp the voltage signals using a series of electrical charge pulses, thereby charging the respective capacitances;
    a pulse counter to increment a pulse count value after each electrical charge pulse; and
    a plurality of registers, each register associated with one of the voltage signals to store the pulse count value when the associated voltage signal is determined to have crossed the threshold voltage level after waiting for voltage signal quiescence.

17. For use in a device that measures capacitance of an electrode by applying an electrical charge to the electrode through an electrode resistance, a method of mitigating effects of the electrode resistance on the capacitance measurement, the method comprising:
    using a series of pulses to charge the capacitance and ramp a resulting voltage signal to cross a threshold voltage level;
    incrementing a pulse count value for each pulse;
    waiting between each pulse for quiescence in the voltage signal voltage; and
    determining the capacitance using the pulse count value when the voltage signal crosses the threshold voltage level.

* * * * *

UNITED STATES PATENT AND TRADEMARK OFFICE
CERTIFICATE OF CORRECTION

| | | |
|---|---|---|
| PATENT NO. | : 7,830,157 B2 | Page 1 of 1 |
| APPLICATION NO. | : 12/027838 | |
| DATED | : November 9, 2010 | |
| INVENTOR(S) | : Bernard Geaghan | |

It is certified that error appears in the above-identified patent and that said Letters Patent is hereby corrected as shown below:

Column 11

Line 24; delete "$C_{14}$," and insert -- $C_{x4}$, -- therefor.

Signed and Sealed this
Fifteenth Day of March, 2011

David J. Kappos
*Director of the United States Patent and Trademark Office*